(12) United States Patent
Xiang et al.

(10) Patent No.: US 7,312,125 B1
(45) Date of Patent: Dec. 25, 2007

(54) FULLY DEPLETED STRAINED SEMICONDUCTOR ON INSULATOR TRANSISTOR AND METHOD OF MAKING THE SAME

(75) Inventors: Qi Xiang, San Jose, CA (US); Paul R. Besser, Sunnyvale, CA (US); Minh Van Ngo, Fremont, CA (US); Eric N. Paton, Morgan Hill, CA (US); Haihong Wang, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 290 days.

(21) Appl. No.: 10/773,026

(22) Filed: Feb. 5, 2004

(51) Int. Cl.
  *H01L 21/336* (2006.01)
(52) U.S. Cl. .................... 438/282; 438/938
(58) Field of Classification Search ............... 438/938, 438/282, 525, 197; 257/E29.193
  See application file for complete search history.

(56) References Cited

U.S. PATENT DOCUMENTS

| | | | |
|---|---|---|---|
| 4,683,645 A | 8/1987 | Naguib et al. ............... 437/41 |
| 4,745,082 A | 5/1988 | Kwok ........................... 437/39 |
| 4,784,718 A | 11/1988 | Mitani et al. ................ 156/643 |
| 4,789,644 A | 12/1988 | Meda ........................... 437/41 |
| 4,835,112 A | 5/1989 | Pfiester et al. ................ 437/24 |
| 4,954,867 A | 9/1990 | Hosaka ......................... 357/52 |
| 4,996,574 A | 2/1991 | Shirasaki ..................... 357/23.7 |
| 4,998,150 A | 3/1991 | Rodder et al. ............... 357/23.1 |
| 5,102,816 A | 4/1992 | Manukonda et al. .......... 437/44 |
| 5,108,954 A | 4/1992 | Sandhu et al. ............... 437/200 |
| 5,120,666 A | 6/1992 | Gotou .......................... 437/40 |
| 5,168,072 A | 12/1992 | Moslehi ........................ 437/41 |
| 5,200,352 A | 4/1993 | Pfiester ........................ 437/44 |
| 5,202,754 A | 4/1993 | Bertin et al. ................. 257/684 |
| 5,258,637 A | 11/1993 | Sandhu et al. ............... 257/384 |
| 5,264,382 A | 11/1993 | Watanabe ..................... 437/41 |
| 5,320,974 A | 6/1994 | Hori et al. ..................... 437/44 |
| 5,321,286 A | 6/1994 | Koyama et al. .............. 257/315 |
| 5,346,834 A | 9/1994 | Hisamoto et al. ............. 437/41 |
| 5,374,575 A | 12/1994 | Kim et al. ..................... 437/44 |
| 5,391,510 A | 2/1995 | Hsu et al. ..................... 437/44 |
| 5,393,685 A | 2/1995 | Yoo et al. ..................... 437/44 |

(Continued)

FOREIGN PATENT DOCUMENTS

JP          61-180466          8/1986

(Continued)

OTHER PUBLICATIONS

Tong et al., Semiconductor Wafer Bonding, Science and Technology, Interscience Technology, a Wiley Interscience publication, Johnson Wiley & Sons, Inc., 1998.*

(Continued)

*Primary Examiner*—Michael Lebentritt
*Assistant Examiner*—Heather Doty
(74) *Attorney, Agent, or Firm*—Foley & Lardner LLP

(57) ABSTRACT

An integrated circuit includes multiple layers. A semiconductor-on-insulator (SOI) wafer can be used to house transistors. Two substrates or wafers can be bonded to form the multiple layers. A strained semiconductor layer can be between a silicon germanium layer and a buried oxide layer. A hydrogen implant can provide a breaking interface to remove a silicon substrate from the silicon germanium layer.

20 Claims, 8 Drawing Sheets

U.S. PATENT DOCUMENTS

| | | | |
|---|---|---|---|
| 5,420,048 A | 5/1995 | Kondo | 437/21 |
| 5,429,956 A | 7/1995 | Shell et al. | 437/29 |
| 5,451,798 A | 9/1995 | Tsuda et al. | 257/139 |
| 5,481,133 A | 1/1996 | Hsu | 257/621 |
| 5,482,877 A | 1/1996 | Rhee | 437/40 RG |
| 5,491,099 A | 2/1996 | Hsu | 437/35 |
| 5,497,019 A | 3/1996 | Mayer et al. | 257/347 |
| 5,516,707 A | 5/1996 | Loh et al. | 437/24 |
| 5,581,101 A | 12/1996 | Ning et al. | 257/347 |
| 5,593,907 A | 1/1997 | Anjum et al. | 437/35 |
| 5,595,919 A | 1/1997 | Pan | 437/29 |
| 5,607,884 A | 3/1997 | Byun | 437/41 |
| 5,612,546 A | 3/1997 | Choi et al. | 257/66 |
| 5,612,552 A | 3/1997 | Owens | 257/202 |
| 5,654,570 A | 8/1997 | Agnello | 257/338 |
| 5,675,159 A | 10/1997 | Oku et al. | 257/284 |
| 5,675,185 A | 10/1997 | Chen et al. | 257/774 |
| 5,689,136 A | 11/1997 | Usami et al. | 257/679 |
| 5,716,861 A | 2/1998 | Moslehi | 437/40 |
| 5,733,792 A | 3/1998 | Masuoka | 437/35 |
| 5,736,446 A | 4/1998 | Wu | 438/305 |
| 5,753,542 A | 5/1998 | Yamazaki et al. | 438/162 |
| 5,789,792 A | 8/1998 | Tsutsumi | 257/506 |
| 5,793,090 A | 8/1998 | Gardner et al. | 257/408 |
| 5,801,075 A * | 9/1998 | Gardner et al. | 438/197 |
| 5,811,323 A | 9/1998 | Miyasaka et al. | 438/151 |
| 5,825,066 A | 10/1998 | Buynoski | 257/345 |
| 5,851,869 A | 12/1998 | Urayama | 438/238 |
| 5,856,225 A | 1/1999 | Lee et al. | 438/291 |
| 5,858,843 A | 1/1999 | Doyle et al. | 438/299 |
| 5,908,307 A | 6/1999 | Talwar et al. | 438/199 |
| 5,915,182 A | 6/1999 | Wu | 438/299 |
| 5,915,196 A | 6/1999 | Mineji | 438/526 |
| 5,936,280 A | 8/1999 | Liu | 257/347 |
| 5,953,616 A | 9/1999 | Ahn | 438/305 |
| 5,960,270 A | 9/1999 | Misra et al. | 438/197 |
| 5,985,726 A | 11/1999 | Yu et al. | 438/301 |
| 6,008,111 A | 12/1999 | Fushida et al. | 438/584 |
| 6,017,808 A | 1/2000 | Wang et al. | 438/528 |
| 6,025,254 A | 2/2000 | Doyle et al. | 438/592 |
| 6,030,863 A | 2/2000 | Chang et al. | 438/231 |
| 6,031,269 A | 2/2000 | Liu | 257/347 |
| 6,033,958 A | 3/2000 | Chou et al. | 438/275 |
| 6,037,204 A | 3/2000 | Chang et al. | 438/231 |
| 6,051,473 A | 4/2000 | Ishida et al. | 438/300 |
| 6,057,200 A | 5/2000 | Prall et al. | 438/300 |
| 6,072,222 A | 6/2000 | Nistler | 257/383 |
| 6,080,645 A | 6/2000 | Pan | 438/585 |
| 6,083,798 A | 7/2000 | Lin | 438/297 |
| 6,087,235 A | 7/2000 | Yu | 438/300 |
| 6,090,691 A | 7/2000 | Ang et al. | 438/564 |
| 6,096,614 A | 8/2000 | Wu | 438/303 |
| 6,103,609 A | 8/2000 | Lee et al. | 438/592 |
| 6,110,783 A | 8/2000 | Burr | 438/286 |
| 6,110,787 A | 8/2000 | Chan et al. | 438/300 |
| 6,124,176 A | 9/2000 | Togo | 438/305 |
| 6,137,149 A | 10/2000 | Kodama | 257/408 |
| 6,150,221 A | 11/2000 | Aoyama | 438/300 |
| 6,156,613 A | 12/2000 | Wu | 438/300 |
| 6,171,910 B1 | 1/2001 | Hobbs et al. | 438/275 |
| 6,184,097 B1 | 2/2001 | Yu | 438/299 |
| 6,187,642 B1 | 2/2001 | Yu et al. | 438/300 |
| 6,190,977 B1 | 2/2001 | Wu | 438/300 |
| 6,200,867 B1 | 3/2001 | Chen | 438/300 |
| 6,211,026 B1 | 4/2001 | Ahmad et al. | 438/300 |
| 6,216,357 B1 | 4/2001 | Victor et al. | 33/810 |
| 6,228,722 B1 | 5/2001 | Lu | 438/279 |
| 6,248,637 B1 | 6/2001 | Yu | 438/300 |
| 6,300,201 B1 | 10/2001 | Shao et al. | 438/281 |
| 6,300,203 B1 | 10/2001 | Buynoski et al. | 438/287 |
| 6,306,722 B1 | 10/2001 | Yang et al. | |
| 6,316,357 B1 | 11/2001 | Lin et al. | 438/662 |
| 6,320,228 B1 | 11/2001 | Yu | 257/350 |
| 6,380,043 B1 | 4/2002 | Yu | 438/305 |
| 6,534,380 B1 * | 3/2003 | Yamauchi et al. | 438/455 |
| 6,900,502 B2 * | 5/2005 | Ge et al. | 257/347 |
| 2002/0072130 A1 * | 6/2002 | Cheng et al. | 438/10 |
| 2004/0053477 A1 * | 3/2004 | Ghyselen et al. | 438/465 |
| 2005/0059242 A1 * | 3/2005 | Cabral et al. | 438/682 |

FOREIGN PATENT DOCUMENTS

| | | |
|---|---|---|
| JP | 3-248433 | 11/1991 |
| JP | 3-288471 | 12/1991 |
| JP | 4-123439 | 4/1992 |
| JP | 4-240762 | 8/1992 |
| JP | 5-160396 | 6/1993 |
| JP | 5-206454 | 8/1993 |
| JP | 8-017845 | 1/1996 |
| JP | 11-102907 | 4/1999 |
| WO | WO 02/095818 A1 | 11/2002 |
| WO | WO 02/101818 A2 | 12/2002 |

OTHER PUBLICATIONS

International Search Report for PCT/US2004/000982, 4 pages.

Huang et al., Sub 50 nm FinFET: PMOS, 1999 IEEE, 4 pages.

Yu et al., Ultra-Thin-Body Silicon-On-Insulator MOSFET's For Terabit-Scale Integration; date unknown, pp. 623-626.

Chatterjee et al., Sub-100nm Gate Length Metal Gate NMOS Transistors Fabricated by a Replacement Gate Process; 1997 IEEE, 5 pages.

Wolf et al., Silicon Processing for the VLSI Era vol. 1: Process Technology, 1986, 15 pages.

Wolf, Silicon Processing for the VLSI Era vol. 2: Process Integration, 9 pages.

Tsai Et al., Recrystallization of Implanted Amorphous Silicon Layers, Electrical Properties of Silicon Implanted with $BF^+_2$ Or $Si^++B^{+a}$), Journal of Applied Physics, vol. 50, No. 1, Jan. 1979, 7 pages.

Chatterjee et al., CMOS Metal Replacement Gate Transistors Using Tantalum Pentoxide Gate Insulator, IEDM 1998, 4 pages.

U.S. Patent Application entitled "Fully Depleted SOI Transistor with Elevated Source and Drain," Inventor: Bin Yu, filed Feb. 9, 2001, 21 pages.

* cited by examiner

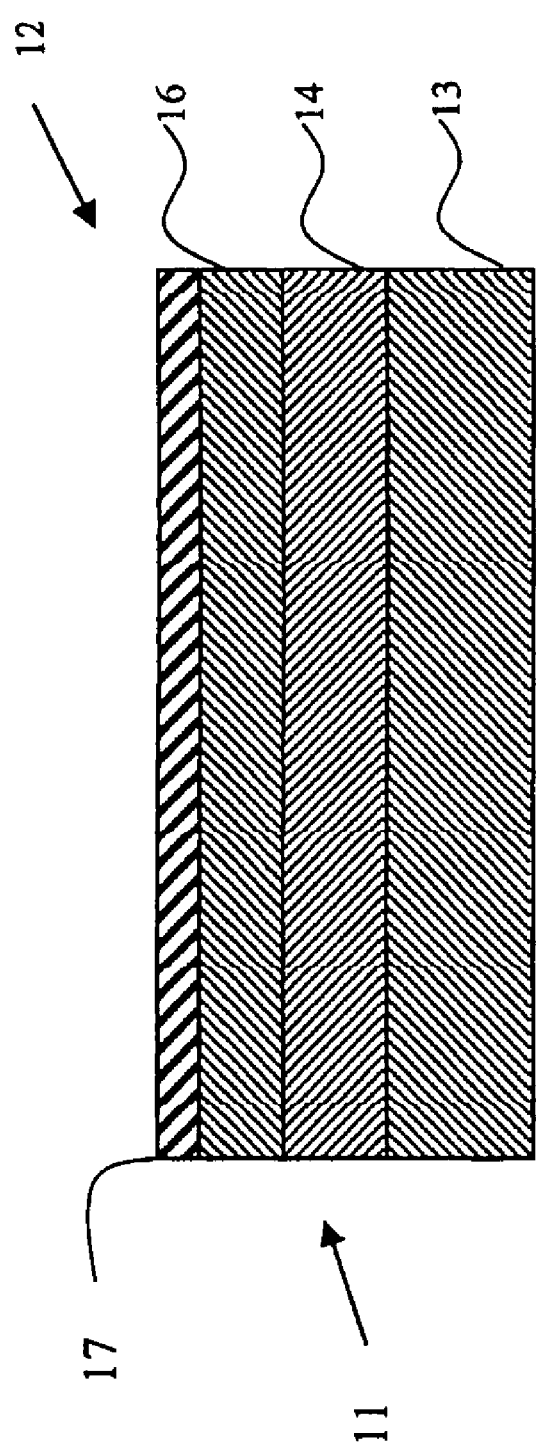
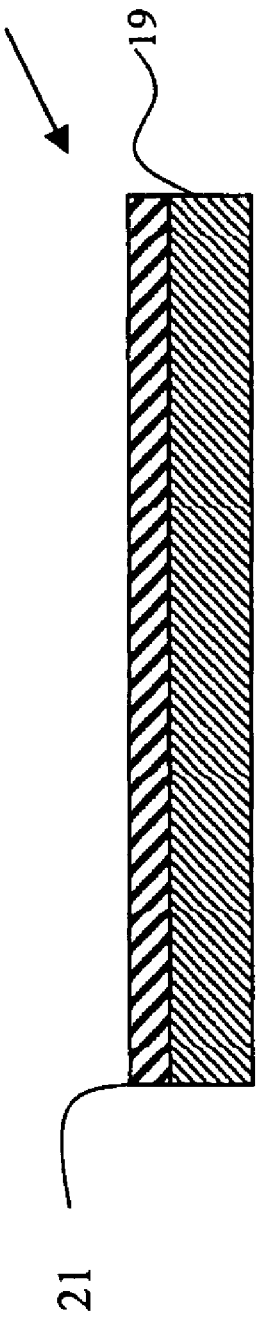
Figure 2
Figure 3

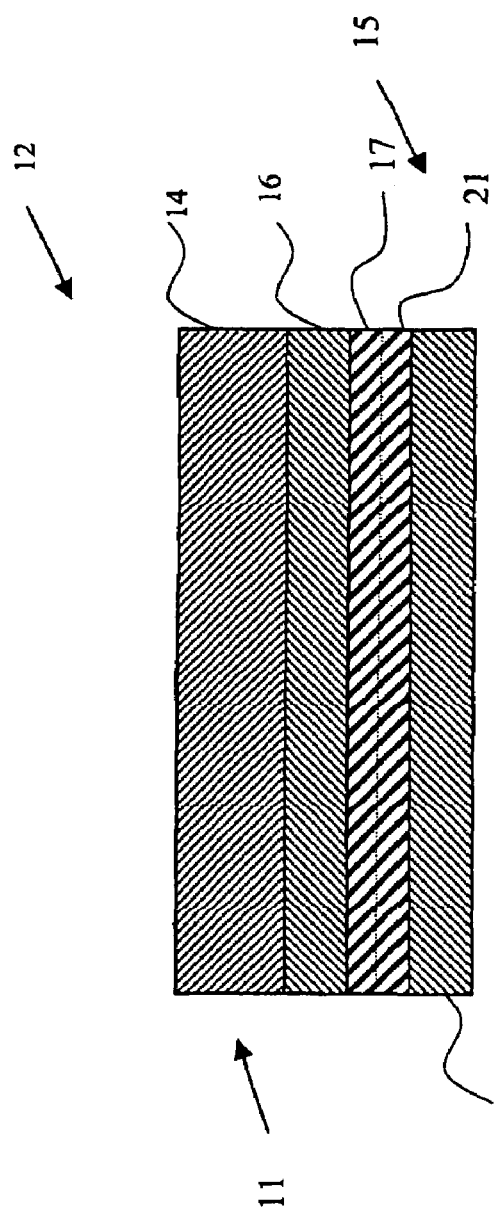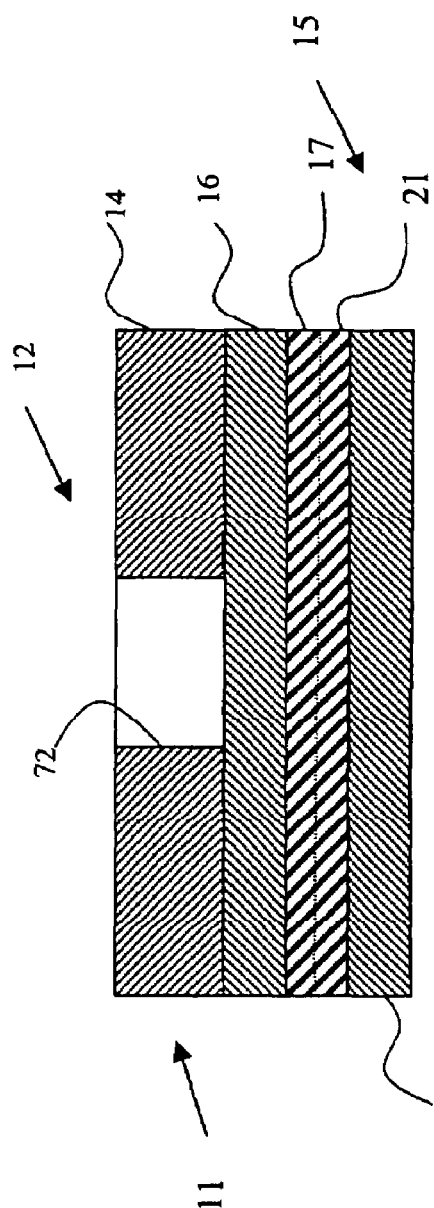

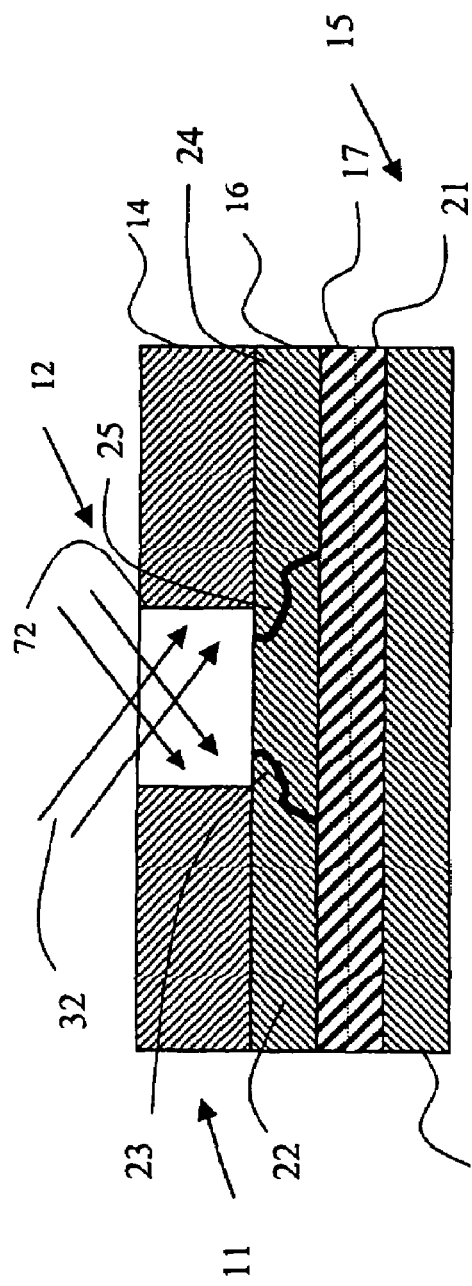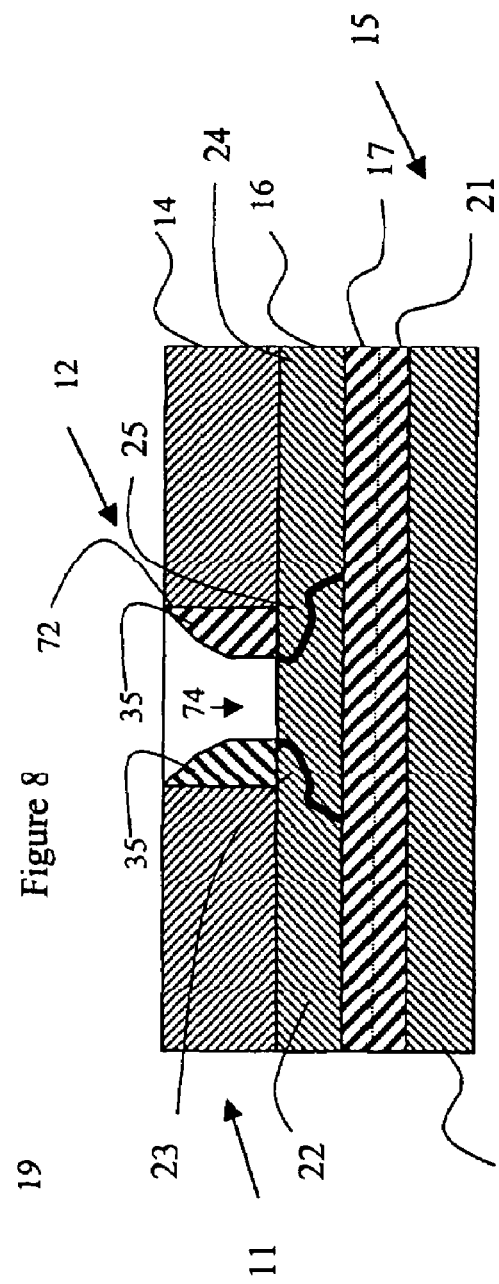
Figure 8
Figure 9

FULLY DEPLETED STRAINED SEMICONDUCTOR ON INSULATOR TRANSISTOR AND METHOD OF MAKING THE SAME

FIELD OF THE INVENTION

The present invention relates to integrated circuit (IC) devices. More particularly, the present invention relates to a strained silicon structure on an insulator substrate.

BACKGROUND OF THE INVENTION

Semiconductor devices such as processors, non-volatile memory, and other circuits include semiconductor elements such as metal oxide semiconductor field effect transistors (MOSFETS), diodes, resistors, and capacitors. For example, flash memory devices employ millions of floating gate FETs and processors employing millions of complementary MOSFETS. MOSFETS are generally disposed in active regions disposed in a base layer or substrate. Active regions typically include heavily doped silicon or other semiconductor regions. The regions can be doped with impurities such as phosphorous (P), boron (B), arsenic (As), or other impurities.

Semiconductor elements such as floating gate transistors and FETs are generally bulk semiconductor-type devices in contrast to semiconductor-on-insulator-type devices such as silicon-on-insulator (SOI) devices. The floating gate transistors and FETs are disposed in a single plane (e.g., a single active layer) on a top surface of a semiconductor substrate such as a single crystal silicon substrate.

Semiconductor-on-insulator (SOI) (e.g., silicon-on-insulator) devices have significant advantages over bulk semiconductor-type devices, including near ideal subthreshold voltage slope, elimination of latch-up, low junction capacitance, and effective isolation between devices. SOI-type devices generally completely surround a silicon or other semiconductor substrate with an insulator. Devices such as conventional FETs or other transistors are disposed on the silicon substrate by doping source and drain regions and by providing gate conductors between the source and drain regions. SOI devices provide significant advantages, including reduced chip size or increased chip density because minimal device separation is needed due to the surrounding insulating layers. Additionally, SOI devices can operate at increased speeds due to reduction in parasitic capacitance. These advantages are particularly important as integration technologies reach sub-100 nanometer levels for CMOS devices.

Conventional SOI devices generally have a floating substrate (i.e., the substrate is often totally isolated by insulating layers). SOI devices can be subject to floating substrate effects, including current and voltage kinks, thermal degradation, and large threshold voltage variations. Generally, SOI devices can include a very thin (200-800 Å thick) silicon film separated from a bulk substrate by a thick buried oxide (e.g., a 2000-3000 Å thick BOX layer).

Strained silicon (SMOS) processes are utilized to increase transistor (e.g., MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer. Germanium can also be implanted, deposited, or otherwise provided to silicon layers to change the lattice structure of the silicon and increase carrier mobility.

The silicon germanium lattice associated with the germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another. Relaxed silicon has a conductive band that contains six equal valance bands. The application of tensile strength to the silicon causes four of the valance bands to increase in energy and two of the valance bands to decrease in energy. As a result of quantum effects, electrons effectively weigh 30 percent less when passing through the lower energy bands. Thus, lower energy bands offer less resistance to electron flow.

In addition, electrons meet with less vibrational energy from the nucleus of the silicon atom, which causes them to scatter at a rate of 500 to 1,000 times less than in relaxed silicon. As a result, carrier mobility is dramatically increased in strained silicon compared to relaxed silicon, providing an increase in mobility of 80 percent or more for electrons and 20 percent or more for holes. The increase in mobility has been found to persist for current fields up to 1.5 megavolt/centimeter. These factors are believed to enable device speed increase of 35 percent without further reduction of device size, or a 25 percent reduction in power consumption without reduction in performance.

Heretofore, it has been difficult to manufacture SMOS devices on SOI substrates. Generally, providing a suitable strained silicon layer above an insulative substrate to achieve the advantage of an SOI substrate can be problematic. In addition, providing a strained silicon layer thin enough for a fully depleted MOSFET above an insulative layer can be difficult using conventional processes. A fully depleted MOSFET is a transistor for which the depletion region encompasses the entire or nearly the entire channel region.

Thus, there is a need for an SOI and strained semiconductor device. Further, there is a need for an SOI device which includes a strained silicon layer. Further still, there is a need for method of manufacturing an SOI structure including a strained silicon layer. Yet further, there is a need for a fully depleted transistor which has some of the advantages of SOI devices and SMOS devices. Even further, there is a need for an efficient method of manufacturing an SMOS device on an insulative substrate. Further still, there is a need for an efficient process for fabricating fully depleted SMOS SOI transistors.

SUMMARY OF THE INVENTION

An exemplary embodiment relates to an integrated circuit. The integrated circuit includes a first wafer including a silicon germanium layer, a strained silicon layer, and a first insulating layer. The integrated circuit also includes a second wafer including a substrate and a second insulating layer. The second insulating layer is attached to the first insulating layer.

Another exemplary embodiment relates to a multi-layer structure containing a plurality of SMOS transistors. The multi-layer structure includes a semiconductor/germanium layer, a strained semiconductor layer below the semiconductor germanium layer, a gate dielectric, and a gate conductor. The strained semiconductor layer is below the semiconductor/germanium layer. The semiconductor/germanium layer includes an aperture. The gate dielectric is above the strained semiconductor layer and within the aperture, and the gate conductor is also within the aperture. The strained semiconductor layer includes a source and a drain.

Still another exemplary embodiment relates to a method of making an SMOS structure containing a plurality of transistors. The method includes providing a first semiconductor substrate including a base layer, a strained semiconductor layer, and a first oxide layer. The method also includes attaching a second semiconductor substrate including a second oxide layer to the first oxide layer and separating the base layer from the first substrate.

BRIEF DESCRIPTION OF THE DRAWINGS

Exemplary embodiments will hereafter be described with reference to the accompanying drawings, wherein like numerals denote like elements, and:

FIG. 2 is a cross-sectional view schematic drawing of a portion of an IC substrate used in the process illustrated in FIG. 1, the IC substrate including a strained silicon layer above a silicon germanium layer;

FIG. 3 is a cross-sectional view of a portion of another IC substrate used in the process illustrated in FIG. 1;

FIG. 6 is a cross-sectional view of the portion illustrated in FIG. 5, showing the portions flipped from the orientation illustrated in FIG. 5;

FIG. 7 is a cross-sectional view of the portions illustrated in FIG. 6, showing an etching step;

FIG. 8 is a cross-sectional view of the portions illustrated in FIG. 7, showing a doping step;

FIG. 9 is a cross-sectional view of the portions illustrated in FIG. 8, showing a spacer formation step;

DETAILED DESCRIPTION OF THE PREFERRED EMBODIMENTS

Figure 1:
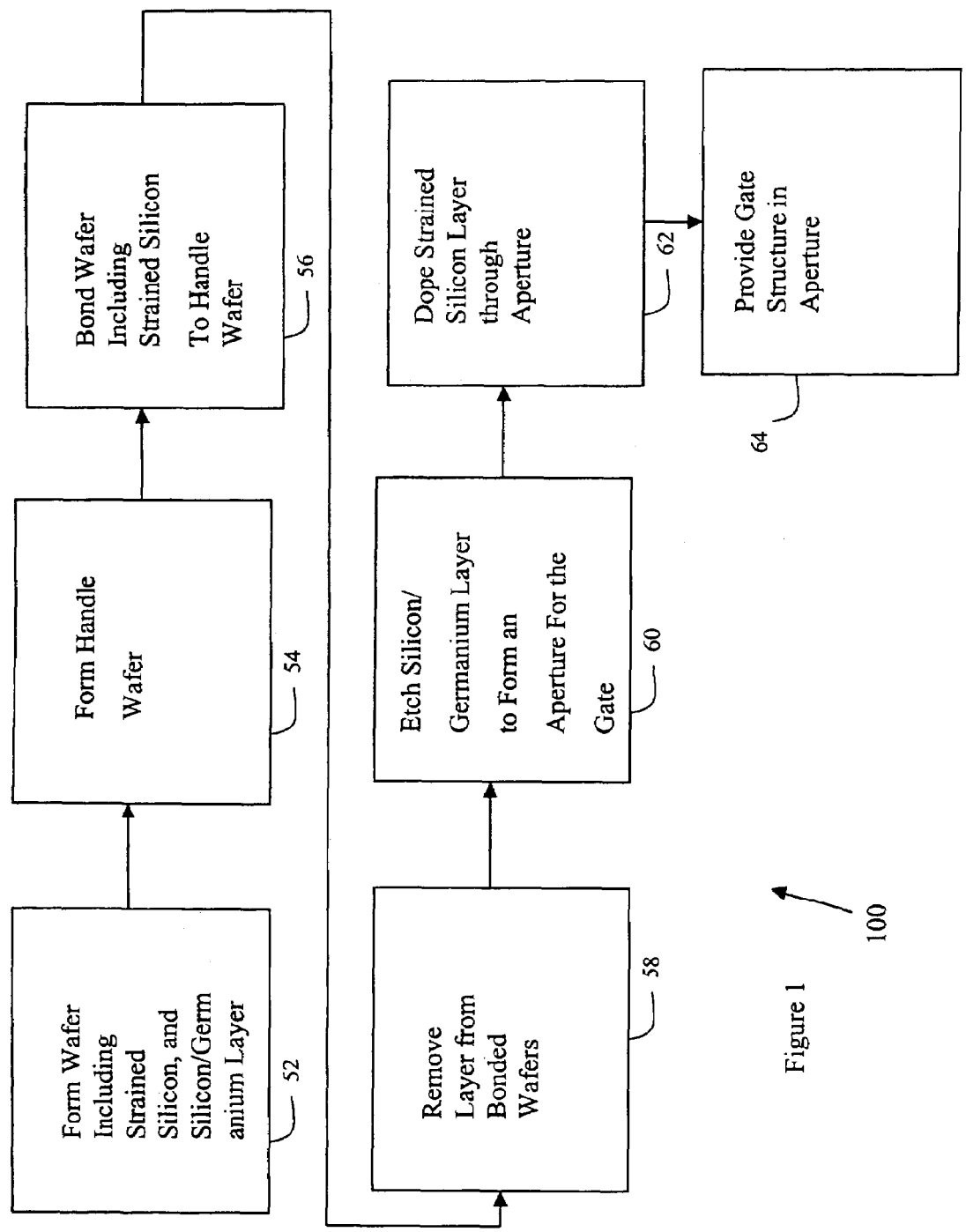
FIG. 1 is a flow diagram showing a process for fabricating a device such as a fully depleted SMOS transistor on an insulator substrate.
Figure 12:
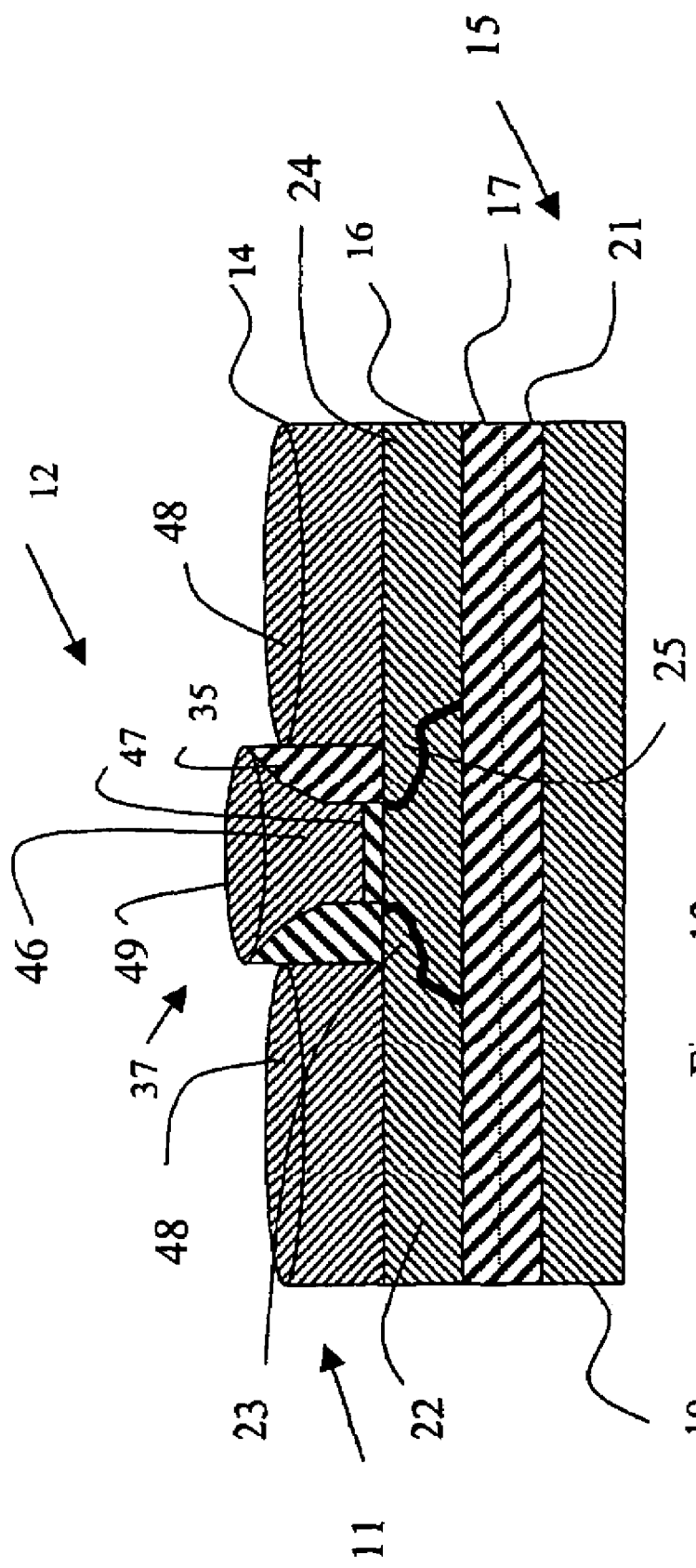
FIG. 12 is a cross-sectional view of the portions illustrated in FIG. 11, showing a silicidation step.

With reference to FIGS. 1 and 12, a portion of a multilayer integrated circuit 12 (FIG. 1) includes a structure 15 and a structure 11 manufactured in a process 100. In one embodiment, process 100 forms transistors in a semiconductor/germanium layer (e.g., a silicon/germanium layer) and a strained silicon layer. A gate conductor is provided in an aperture in the semiconductor/germanium layer. The strained layer can be doped through the aperture in the semiconductor/germanium layer. The strained layer is disposed above an insulating substrate or buried oxide (BOX) layer.

Integrated circuit 12 (FIG. 12) is preferably a strained semiconductor (SMOS) semiconductor-on-insulator (SOI) device. Structure 11 preferably includes a transistor (e.g., a fully depleted field effect transistor or FD MOSFET). Structure 15 supports structure 11 and is provided below structure 11.

Structure 11 can be built on a bulk substrate including germanium, a semiconductor bulk substrate, or another IC substrate. Structure 11 preferably includes a strained semiconductor layer, such as a strained silicon layer 16.

Structure 15 includes a support substrate 19 and an insulating layer 21. Support substrate 19 can be a silicon substrate that along with layer 21 assists the formation of the SOI structure of integrated circuit 12.

Integrated circuit 12 can include a semiconductor device or portion thereof made from any of the various semiconductor processes such as a complementary metal oxide semiconductor (CMOS) process or any other semiconductor process. The portion of integrated circuit 12 shown in FIG. 12 may be an entire IC or a portion of an IC and may include a multitude of electronic components. Devices and interconnections for integrated circuit 12 can be located on structures 11 and 15 as well as on additional layers provided on structures 11 and 15.

Structure 11 includes a silicon/germanium layer 14, (e.g., a semiconductor/germanium layer), a strained semiconductor layer 16 (e.g., a strained silicon layer), and an insulating layer 17. Insulating layer 17 of structure 11 and insulating layer 21 of structure 15 are preferably bonded together at an interface represented by a dotted line between layers 17 and 21.

Process 100 can be utilized to form integrated circuit 12. According to process 100, structure 11 is formed including strained silicon layer 16 and silicon germanium layer 14 in a step 52. In a step 54, structure 15 is provided. Structure 15 can be comprised of a handle wafer substrate such as substrate 19. Insulating layer 21 can be grown or deposited upon substrate 19. Similarly, an insulative layer 17 can be grown upon layer 21. Alternatively, substrate 19 and structure 11 can be purchased with respective layers 17 and 21 already formed.

In a step 56, structures 11 and 15 are coupled together to form a compound multilayer structure in a step 56. Preferably, layers 17 and 21 are bonded by any known technique, such as a hydrogen bonding technique. Advantageously, structure 11 includes strained silicon layer 16 above insulative layers 17 and 21, thereby providing the advantages of SMOS and SOI processes.

In a step 58, support layers and other unnecessary layers associated with structure 11 can be removed from a top surface of layer 14. In a step 60, an aperture can be etched through layer 14 to form a gate structure. In a step 62, layer 16 can be doped to form source and drain extensions through the aperture associated with the gate structure. In a step 64, a gate structure 37 can be provided in the aperture.

With reference to FIG. 12, various processes can be utilized to form various structures for integrated circuit 12. In one embodiment, integrated circuit 12 can include silicided source and drain regions 22 and 24 and source and drain extensions 23 and 25. Source and drain regions 22 and 24 associated with layer 14 as well as a gate conductor 46 can be silicided to form silicided regions 48 and 49, respectively. Preferably, insulative spacers 35 and a gate structure 37 can be formed in the aperture.

The transistor associated with source and drain regions 22 and 24 preferably is fully depleted so that the depletion region extends through the entire thickness of layer 16. Gate structure 37 between source and drain regions 22 and 24 includes a gate conductor 46 and a gate dielectric 47.

Gate dielectric 47 is preferably 5-30 Angstroms thick. Gate dielectric 47 can be silicon dioxide ($SiO_2$), silicon nitride ($Si_3N_4$) or a high-k dielectric material.

Gate conductor 46 is surrounded by dielectric spacers 35. Gate conductor 46 can be a metal or doped polysilicon material. Dielectric spacers 35 can be comprised of a silicon dioxide or silicon nitride material.

Source and drain regions 22 and 24 preferably extend through the entire thickness of layer 16. Source region 22 and drain region 24 are preferably 100-200 Angstroms deep preferably formed by ion implantation. Extensions 23 and 25 are not necessary in the fully depleted embodiment of the transistor. Regions 22 and 24 can have a concentration of between approximately $10^{19}$ to $10^{21}$ dopants per $cm^3$. The dopants can include boron (B), arsenic (As), phosphorous (P), boron difluoride ($BF_2$), etc.

Referring to FIGS. 2 through 12, a cross-sectional view of the portion of integrated circuit (IC) 12 is illustrated, integrated circuit 12 is subjected to process 100 (FIG. 1) to form an IC including at least one transistor. Integrated circuit 12 can include a multitude of fully depleted SMOS, SOI transistors with a gate structure 37 and silicided source and drain regions 22 and 24 fabricated as explained below.

In FIG. 2, multilayer structure 11 is a provided as an integrated circuit wafer including a strained layer such as strained silicon layer 16 provided over a semiconductor/germanium layer such as silicon/germanium layer 14. Layer 14 can be provided above a substrate 13.

Substrate 13 is optional and integrated circuit 12 can be provided with layer 14 as the bottom-most layer. Substrate 13 can be the same material or a different material than layer 14. In one embodiment, substrate 13 is a semiconductor substrate, such as a silicon substrate upon which layer 14 has been grown.

Silicon/germanium layer 14 is preferably a silicon germanium or other semiconductor material including germanium, and can be doped with P-type dopants or N-type dopants. Layer 14 can be an epitaxial layer provided on a semiconductor or an insulative base, such as substrate 13. Furthermore, layer 14 is preferably a composition of silicon germanium ($Si_{1-x}Ge_x$, where X is approximately 0.2 and is more generally in the range of 0.05-0.3). Layer 14 can be grown or deposited.

In one embodiment, layer 14 is grown above substrate 13 by chemical vapor deposition (CVD) using disilane ($Si_2H_6$) and germane ($GeH_4$) as source gases with a substrate temperature of approximately 650° C., a disilane partial pressure of approximately 30 mPa and a germane partial pressure of approximately 60 mPa. Growth of silicon germanium material may be initiated using these ratios, or, alternatively, the partial pressure of germanium may be gradually increased beginning from a lower pressure of zero pressure to form a gradient composition. Alternatively, a silicon layer can be doped by ion implantation with germanium or by another process to form layer 14. Preferably, silicon/germanium layer 14 is grown by epitaxy to a thickness of less than approximately 5000 Å (and preferably between approximately 1500 Å and 4000 Å).

Strained silicon layer 16 is formed above layer 14 by an epitaxial process. Preferably, layer 16 is grown by chemical vapor deposition (CVD) at a temperature of approximately 650° C. using silane or dichlorosilane. Layer 16 can be a pure silicon layer and have a thickness of 100-200 Å. Layer 14 maintains the strained nature of layer 16 throughout process 100.

Layers 14 and 16 can include isolation regions which separate active regions for transistors on structure 11. Isolation regions can be insulating regions such as silicon dioxide regions formed in conventional local oxidation of silicon (LOCOS) processes. Alternatively, isolation regions can be formed in a shallow trench isolation (STI) process.

Structure 11 can include an insulating layer 17. Insulating layer 17 is preferably a thermally grown or deposited silicon dioxide layer having a thickness of approximately 200-400 Å. In an alternative embodiment, layer 17 can be deposited as high-temperature oxide or in a tetraethylorthosilicate (TEOS) based process. In another alternative, layer 17 can be formed in an oxygen ion implantation process. Layer 17 is preferably utilized in the bonding technique associated with step 56 of process 100.

In FIG. 3, multilayer structure 15 is provided in accordance with step 54 of process 100. In one embodiment, structure 15 includes a handle wafer or substrate 19 and an insulating layer 21. Preferably, substrate 19 is a silicon material and layer 21 is a silicon dioxide material similar to layer 17. Layer 21 can be formed in a process similar to the process used to form layer 17 (FIG. 2). In one embodiment, structure 15 is a conventional handle wafer and is 100 microns thick and layer 21 is 200-400 Å thick.

Figure 4:
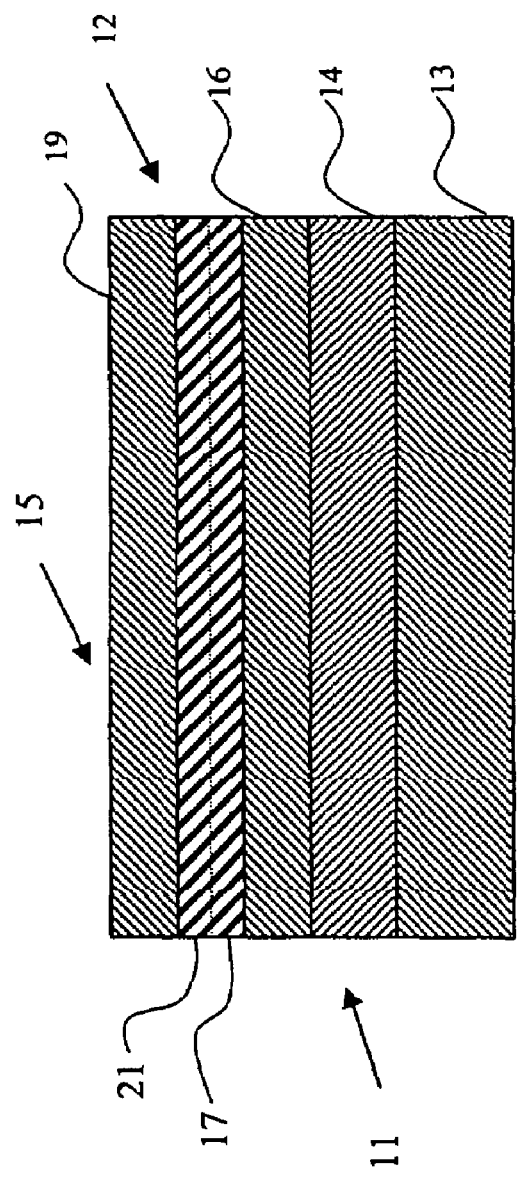
FIG. 4 is a cross-sectional view of the portion illustrated in FIG. 3, showing a step that combines the portion illustrated in FIG. 2 with the portion illustrated in FIG. 3.

In FIG. 4, structure 11 is bonded to structure 15 in step 56. In a preferred embodiment, layer 17 of structure 11 is bonded to layer 21 of structure 15 at an interface represented by a dashed line. Any of a variety of attachment or bonding techniques can be utilized to form integrated circuit 12 including structures 11 and 15.

In FIG. 4, structure 15 is inverted or flipped over with respect to its orientation shown in FIG. 3. Preferably, structure 15 is flipped top over bottom with respect to its orientation in FIG. 5 so that insulating layer 21 contacts insulating layer 17 of structure 11.

Preferably, wafer bonding (bonding of structures 11 and 15) is completed at room temperature and in a nitrogen ($N_2$) ambient atmosphere in step 56. The wafer bonding is completed by atomic force. Alternatively, higher temperatures can be utilized during bonding.

In one embodiment, Smart-Cut® and Unibond® techniques can be utilized to bond structures 11 and 15. Smart-Cut® and Unibond® techniques are discussed in "Smart-Cut®: The Basic Fabrication Process for UNIBOND® SOI Wafers," by Auberton-Herue, Bruel, Aspar, Maleville, and Moriceau (IEEE TRANS ELECTRON, March 1997), incorporated herein by reference. The Smart-Cut® and Unibond® techniques can reach temperatures of 110° C. to bond layers 17 and 21 together.

The Smart-Cut® and UNIBOND® techniques utilize a combination of hydrogen implantation and wafer bonding to form an SOI substrate. Applicants have modified the techniques to attach a strained silicon layer containing structure (structure 11) to a handle wafer (structure 15) to form a strained silicon on SOI layer. OH terminated clean oxide surfaces on layers 17 and 21 in hydrophilic conditions can be used to bond structures 11 and 15. Hydrogen bonding at the surfaces is achieved through water adsorption.

Alternative techniques for attaching wafers can be utilized without departing from the scope of the claims. For example, structures 11 and 15 can be bonded by an adhesive or other chemical means.

Figure 5:
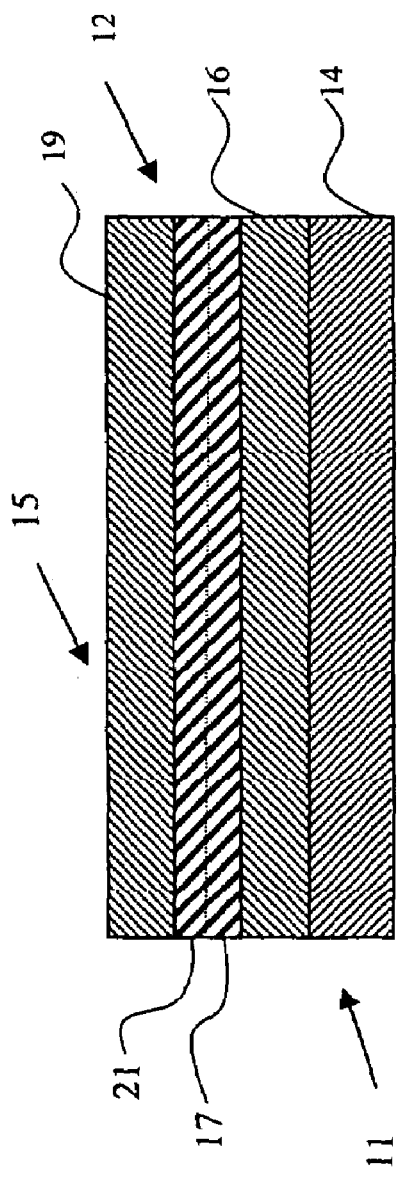
FIG. 5 is a cross-sectional view of the portions illustrated in FIG. 4, showing a layer removal step.

In FIG. 5, after structures 11 and 15 are bonded, layer or substrate 13 of structure 11 is removed in step 58. Removal of layer substrate 13 leaves layers 14, 16 and 17 attached to structure 15. A mechanical process can be utilized to cleave substrate 13 from layer 14. The process leaves layer 14 as the top (exposed) surface of layer 16. Alternatively, substrate 13 can be removed by polishing or etching.

In one embodiment, a hydrogen breaking interface can be formed at the interface of layer 14 and substrate 13 or within a bottom portion of layer 14. The hydrogen breaking interface can be used to separate substrate 13 from layer 14 in a Smart-Cut® process.

FIG. 6 shows integrated circuit 12 inverted or flipped from its orientation shown in FIG. 5. In FIG. 6, integrated circuit 12 includes layer 14 above layer 16, and structure 11 above structure 15.

In FIG. 7, an aperture 72 is formed in layer 14 in accordance with step 58. In a preferred embodiment, aperture 72 is formed in a photolithographic process. Aperture 72 preferably has a width of 2000 A depending upon desired gate length and a depth equal to that of layer 14.

In one embodiment, aperture 72 can be less than 500 A Angstroms deep formed by dry etching. In another embodiment, aperture 72 can extend into layer 16. Various etching processes selective to layer 14 can be utilized.

In one embodiment, an etching process which monitors the presence of germanium in etching byproducts is utilized. The reduction of the presence of germanium in the etching byproducts indicates that layer 16 has been reached (i.e., layer 16 does not include significant amounts of germanium). The etching process is preferably selective to silicon germanium with respect to silicon at a 2:1 ratio. The etching processes can be $CF_4$, $SF_6$, $CF_2CL_2$, HBr, and $SF_6/H_2/CF_4$ processes (preferably $CF_4$ and $SF_6$ processes).

In FIG. 8, layer 16 is doped by an ion implantation to form source and drain regions 22 and 24. In another embodiment, source and drain regions can be provided during any part of process 100. Alternatively, layer 16 and layer 14 can be doped for regions 22 and 24 by other techniques.

Layer 14 serves as a mask for the appropriate formation of extensions 23 and 25. In one embodiment, an angled dopant extension implant 32 can be utilized. Preferably, dopants are accelerated at an energy of 1×10 keV at an angle of 15-45 and a dose of 14-15 through aperture 72. Alternative methods can be utilized to form extensions 23 and 25. The dopants can be B, P, As, $BF_2$, Sb, etc.

According to an alternative embodiment, spacers similar to spacers 35 can include dopants which are driven into extensions 23 and 25. In yet another embodiment, source and drain regions 22 and 24 and extensions 23 and 25 can formed by a conventional doping process before aperture 72 is formed.

In FIG. 9, spacers 35 are formed in aperture 72. Preferably, a deposition and etch-back process is utilized to form spacers 35. Spacers 35 can be formed by depositing silicon nitride or silicon dioxide material and etching in an anisotropic dry etch process. Preferably, an aperture 74 exists between spacers 35. Spacers 35 can have a width of 500 A and a height of 300-500 A. Preferably, spacers 35 have an initial height that is the same height as layer 14.

Figure 10:
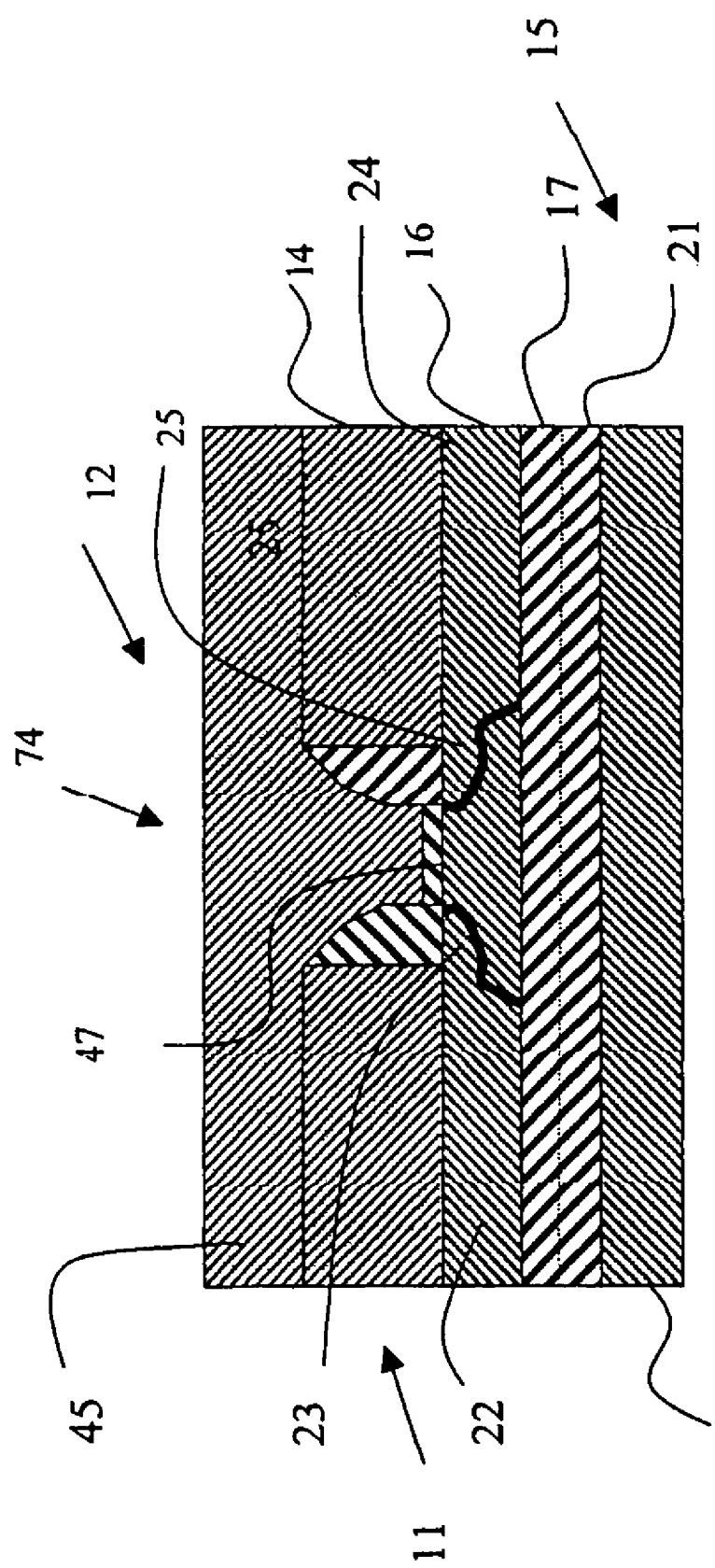
FIG. 10 is a cross-sectional view of the portions illustrated in FIG. 9, showing a gate dielectric and gate conductor provision step.

In FIG. 10, a gate dielectric layer 47 is provided in aperture 74. Gate dielectric layer 47 can be a thermally grown silicon nitride layer or a thermally grown silicon dioxide layer. In another embodiment, layer 47 is deposited and etched at an angle to leave layer 47 at the bottom of aperture 74. Alternative processes can be utilized for forming layer 47 in aperture 74. Layer 47 can also be a high-k dielectric layer.

In FIG. 10, aperture 74 is filled with a conducting material 45 for gate conductor 46 in accordance with step 64 of process 100. Preferably, conducting material 45 is deposited as a conformal layer of polysilicon or metal material. In one embodiment, conducting material 45 is a metal material having different etch properties than layer 14. In another embodiment, a hard mask layer or barrier, buffer layer, or combination of both is provided between layer 14 and conducting material 45.

Figure 11:
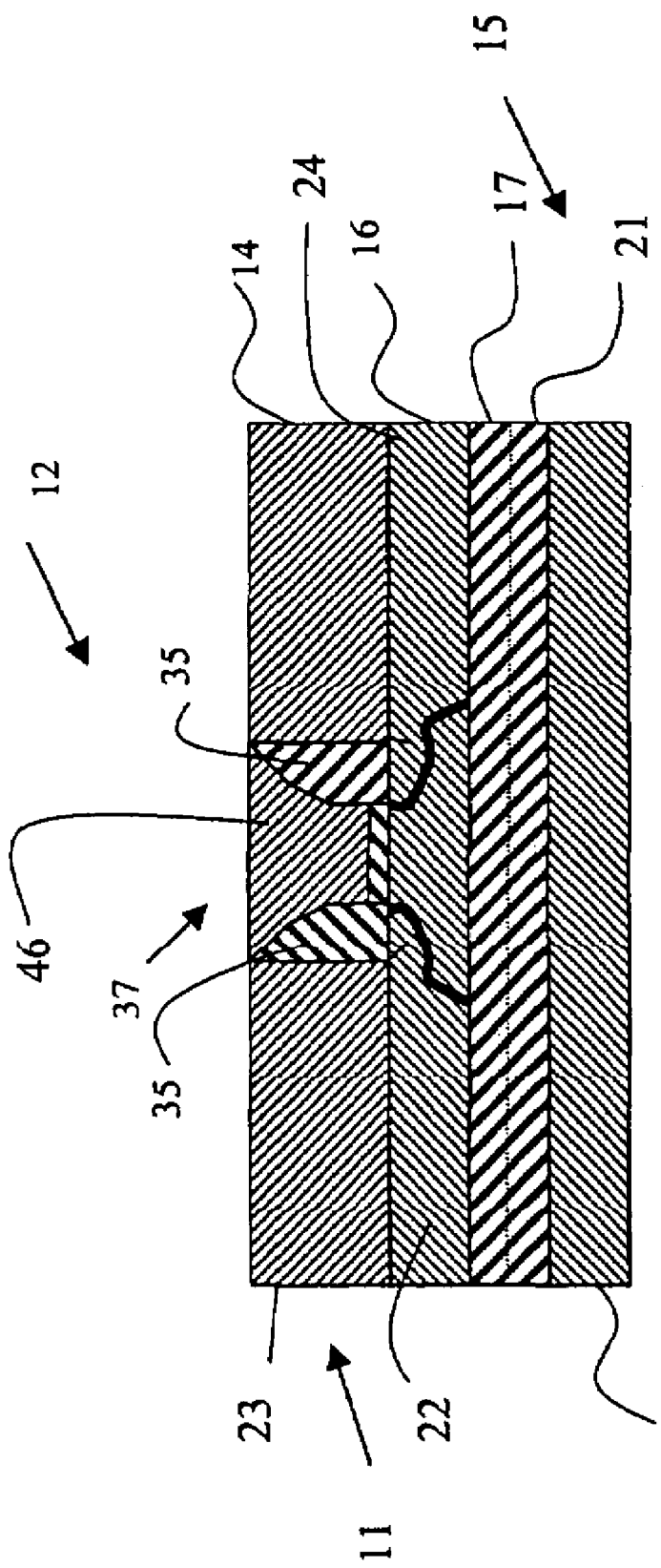
FIG. 11 is a cross-sectional view of the portions illustrated in FIG. 10, showing a polishing step.

In FIG. 11, conducting material 45 is removed from above layer 14 to complete gate structure 37. In FIG. 12, layer 14 is etched or otherwise partially removed to lower its top surface below a top surface of gate conductor 46. After lowering the top surface of layer 14, layer 14 above source region 22 and drain region 24 can be silicided to form silicide regions 48. In addition, gate conductor 46 can be silicided to form silicide region 49. Preferably, a nickel silicidation process is utilized. Nickel material is sputter deposited and annealed to form regions 48 and 49. Various techniques and various materials can be utilized to form silicide regions 48 and 49.

An insulating layer can be deposited above integrated circuit 12 shown in FIG. 12. Various interconnection processes and interconnect layers can be utilized to provide circuitry associated with integrated circuit 12.

With reference to FIG. 6, in an alternative embodiment of process 100, an etch stop layer such as silicon nitride can be provided above layer 14. In FIG. 7, aperture 72 is provided through the etch stop layer as well as layer 14.

In FIG. 9, spacers 35 are formed in aperture 72. Spacers 35 in this alternative embodiment are formed such that the top of spacers 35 is coplanar with the top of the etch stop layer above layer 14. The etch stop layer provides an additional advantage of allowing spacers to be polished back until the etch stop layer is reached.

In FIG. 11, conducting material 45 for gate conductor 46 is deposited over the etch stop layer and polished until the etch stop layer is reached, thereby leaving gate conductor 46 in aperture 74. After polishing material 45, the etch stop layer can be removed in a conventional stripping process, thereby leaving spacers 35 above a top surface associated with layer 14. Such an alternative process allows spacers 35 to more adequately insulate gate conductor 46 from layer 14.

It should be understood that the detailed drawings and specific examples describe exemplary embodiments of the present invention and are provided for the purpose of illustration only. The apparatus and method of the invention is not limited to the precise details, geometries, dimensions, materials, and conditions disclosed. For example, although particular layers are described as being particular sizes, other sizes can be utilized. Further still, although polysilicon is used as a gate conductor, other conductor materials can be utilized. Even further still, the drawings are not drawn to scale. Various changes can be made to the precise details discussed without departing from the spirit of the invention which is defined by the following claims.

What is claimed is:

1. A method of making an IC structure containing a plurality of transistors, the method comprising:
providing a semiconductor structure including a base layer, a semiconductor/germanium layer, a strained semiconductor layer and a first oxide layer;
attaching a second semiconductor structure including a second oxide layer to the first oxide layer;
separating the base layer from the first structure; and
providing an aperture in the semiconductor/germanium layer for each of the plurality of transistors.

2. The method of claim 1, wherein the semiconductor/germanium layer is above the strained semiconductor layer.

3. The method of claim 1, further comprising:
doping the strained semiconductor layer through the aperture.

4. The method of claim 3, wherein the doping step forms source and drain extensions.

5. The method of claim 1, further comprising:
providing a gate conductor in the aperture.

6. The method of claim 5, further comprising:
separating the gate conductor from the semiconductor/germanium layer with a spacer material.

7. The method of claim 2, further comprising:
etching the semiconductor/germanium layer before siliciding; and
siliciding the semiconductor/germanium layer.

8. The method of claim 1, wherein the attaching step is a hydrogen bonding step.

9. A method of manufacturing an integrated circuit containing a plurality of transistors, the integrated circuit comprising a first wafer and a second wafer, the first wafer including a base layer, a semiconductor/germanium layer, a strained semiconductor layer, and a first insulating layer, the second wafer including a substrate and a second insulating layer, the second insulating layer being attached to the first insulating layer, the method comprising steps of:
providing the first wafer including the base layer, the semiconductor/germanium layer, the strained semiconductor layer, and the first insulating layer;
attaching the first insulating layer to the second insulating layer so that the second wafer and the first wafer are attached;
separating the base layer from the first wafer; and
providing an aperture in the semiconductor/germanium layer for each of the plurality of transistors.

10. The method of claim 9 wherein the substrate is a bulk silicon substrate.

11. The method of claim 9, wherein the substrate is a semiconductor material.

12. The method of claim 11, wherein the semiconductor/germanium layer includes a hydrogen breaking interface.

13. The method of claim 9, wherein a channel region is disposed in the strained semiconductor layer.

14. The method of claim 13, wherein a source region and a drain region are disposed in the strained semiconductor layer.

15. The method of claim 14, wherein an aperture is formed in the semiconductor/germanium layer to expose the strained semiconductor layer.

16. The method of claim 15, wherein a gate structure is provided in the aperture.

17. A method of fabricating a multilayer structure containing a plurality of transistors including strained regions, the multilayer structure comprising a semiconductor/germanium layer, a strained semiconductor layer, a gate dielectric, and a gate conductor including a source and a drain provided below the semiconductor/germanium layer, the semiconductor/germanium layer having an aperture, the gate dielectric above the strained semiconductor layer and within the aperture, the gate conductor being disposed within the aperture, the method comprising:
providing a first substrate including the semiconductor/germanium layer, the strained semiconductor layer, and a first oxide layer;
attaching a second substrate including a second oxide layer to the first oxide layer;
providing the aperture within the semiconductor/germanium layer; and
providing the gate dielectric and gate conductor within the aperture.

18. The method of claim 17, further comprising:
providing a spacer in the aperture separating the semiconductor/germanium layer and the gate conductor.

19. The method of claim 17, further comprising:
etching the semiconductor/germanium layer before providing a silicide layer.

20. The method of claim 17, further comprising:
doping the strained semiconductor layer through the aperture.

* * * * *

UNITED STATES PATENT AND TRADEMARK OFFICE
CERTIFICATE OF CORRECTION

| | |
|---|---|
| PATENT NO. | : 7,312,125 B1 |
| APPLICATION NO. | : 10/773026 |
| DATED | : December 25, 2007 |
| INVENTOR(S) | : Qi Xiang et al. |

It is certified that error appears in the above-identified patent and that said Letters Patent is hereby corrected as shown below:

Column 8:
line 55, before "semiconductor" insert --first--.

Signed and Sealed this

Seventeenth Day of June, 2008

JON W. DUDAS
*Director of the United States Patent and Trademark Office*